United States Patent
Okamoto

(10) Patent No.: US 6,573,693 B2
(45) Date of Patent: Jun. 3, 2003

(54) CURRENT LIMITING DEVICE AND ELECTRICAL DEVICE INCORPORATING THE SAME

(75) Inventor: Yujiro Okamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/945,672

(22) Filed: Sep. 5, 2001

(65) Prior Publication Data

US 2002/0033727 A1 Mar. 21, 2002

(30) Foreign Application Priority Data

Sep. 19, 2000 (JP) ........................................ 2000-282918

(51) Int. Cl.[7] .............................. G05F 5/00; G05F 1/40; G05F 1/44
(52) U.S. Cl. ........................ 323/273; 323/303; 323/282
(58) Field of Search ................................. 323/303, 284, 323/282, 274, 273

(56) References Cited

U.S. PATENT DOCUMENTS

| | | | | | |
|---|---|---|---|---|---|
| 5,764,041 A | * | 6/1998 | Pulvirenti et al. | ........... | 323/273 |
| 5,831,466 A | * | 11/1998 | Pulvirenti et al. | ........... | 327/194 |
| 5,900,724 A | * | 5/1999 | Pollmeier et al. | ............. | 307/44 |
| 6,184,669 B1 | * | 2/2001 | Matsuo | ........................ | 323/273 |
| 6,218,816 B1 | * | 4/2001 | Fritz et al. | ................... | 323/274 |
| 6,265,856 B1 | * | 7/2001 | Cali' et al. | ................... | 323/273 |

* cited by examiner

Primary Examiner—Bao Q. Vu
(74) Attorney, Agent, or Firm—Arent Fox Kintner Plotkin & Kahn, PLLC

(57) ABSTRACT

Conventionally, in an electrical device having an output transistor for limiting an input current to produce an output current and a bypass capacitor connected to the output side of the output transistor, the waveform of the current that charges the bypass capacitor cannot be adjusted without varying the capacitance of the bypass capacitor. In an electrical device embodying the invention, the waveform of the current that charges the bypass capacitor can be adjusted by varying the limit value of the output current without varying the capacitance of the bypass capacitor.

18 Claims, 6 Drawing Sheets

US 6,573,693 B2

CURRENT LIMITING DEVICE AND ELECTRICAL DEVICE INCORPORATING THE SAME

BACKGROUND OF THE INVENTION

1. Field of the Invention

The present invention relates to an electrical device having an output transistor for limiting an input current to produce an output current and a bypass capacitor connected to the output side of the output transistor.

2. Description of the Prior Art

Since its debut some time ago, the USB (universal serial bus) has been receiving much attention as an interface bus for connecting a host computer, such as a personal computer, to a peripheral device, such as a floppy disk drive, printer, scanner, or the like. Peripheral devices equipped with a USB (hereinafter such devices will be referred to as "USB devices") make it possible to use a single unified interface for a plurality of peripheral devices that have conventionally been requiring different interfaces.

A USB device is connected to a host computer by way of a USB cable. For easy connection and convenience, the USB cable includes not only signal lines by way of which signals are exchanged between the USB device and the host computer, but also power supply lines by way of which electric power is supplied from the host computer to the USB device.

Moreover, the USB device is equipped with a high side switch circuit for making "softer" (less abrupt) the rising of the rush current that occurs when the USB device is plugged into the host computer, and thus the power supply lines of the USB cable are connected through the high side switch circuit to the internal circuits of the USB device. The high side switch circuit is configured as a current limiter that limits the supply current supplied from the host computer to a predetermined level before it is fed to the internal circuits.

FIG. 10 is a circuit diagram showing an example of the configuration of a conventional high side switch circuit. As this figure shows, the high side switch circuit 10' is provided with an output transistor Q1 that limits the supply current supplied from outside the device to produce an output current to be output to the internal circuits of the device. The figure shows an example in which a P-channel MOS transistor is used as the output transistor Q1.

The supply current fed from outside the device is fed in via an input terminal T1. The input terminal T1 is connected through a resistor R1 to the source (S) of the transistor Q1, and is also connected through serially connected resistors R2 and R3 and then through a constant-current source 11 to ground. The current that is to be fed to the internal circuits of the device is fed out via an output terminal T2. The output terminal T2 is connected to the drain (D) of the transistor Q1, and is also connected through a bypass capacitor C1 to ground.

Moreover, the high side switch circuit 10' is provided with an operational amplifier A1 as a means for controlling the gate voltage of the transistor Q1. The non-inverting input terminal (+) of the operational amplifier A1 is connected to the node between the resistors R2 and R3, and its inverting input terminal (−) is connected to the source (S) of the transistor Q1. The output terminal of the operational amplifier A1 is connected to the gate (G) of the transistor Q1.

Now, how this high side switch circuit 10' configured as described above operates will be described. The operational amplifier A1 amplifies the voltage difference between the reference voltage $V_{ref}$ fed to its non-inverting input terminal (+) and the comparison voltage $V_{adj}$ fed to its inverting input terminal (−), and thereby produces the gate voltage of the transistor Q1.

For example, when a large current flows through the transistor Q1, the voltage drop across the resistor R1 becomes greater. Thus, the comparison voltage $V_{adj}$ drops, and the output voltage of the operational amplifier A1 becomes higher. As a result, the voltage difference between the gate and source of the transistor Q1 becomes smaller, and thus the transistor Q1 now permits only a smaller current to flow through it. By contrast, when the current that flows through the transistor Q1 becomes smaller, and thus the comparison voltage $V_{adj}$ becomes higher, the output voltage of the operational amplifier A1 becomes lower. As a result, the voltage difference between the gate and source of the transistor Q1 becomes greater, and thus the transistor Q1 now permits a larger current to flow through it.

In this way, the high side switch circuit 10' is a circuit that limits the output current $I_{out}$ that flows through the transistor Q1 in such a way that the comparison voltage $V_{adj}$ is kept equal to the predetermined reference voltage $V_{ref}$. In this high side switch circuit 10' configured as described above, setting the reference voltage $V_{ref}$ higher results in making the target value of the output current $I_{out}$ smaller and, by contrast, setting the reference voltage $V_{ref}$ lower results in making the target value of the output current $I_{out}$ greater. Conventionally, the reference voltage $V_{ref}$ is fixed at a voltage determined on the basis of the ultimate target value of the output current $I_{out}$ to be fed to the internal circuits of the device.

FIG. 11 is a time chart showing the behavior of the input voltage $V_{in}$ and the output current $I_{out}$ in the high side switch circuit 10'. As solid lines in this figure indicate, when an input voltage $V_{in}$ is applied to the input terminal T1 of the high side switch circuit 10', an output current $I_{out}$ starts flowing through the bypass capacitor C1. Here, the rising of the output current $I_{out}$ that charges the bypass capacitor C1 is made softer to a certain degree by the high side switch circuit 10'.

The peak value of the current that charges the bypass capacitor C1 and the time needed to charge it are determined by the capacitance of the bypass capacitor C1 and the reference voltage $V_{ref}$ of the high side switch circuit 10' (i.e. the target value of the output current $I_{out}$). In FIG. 11, what the solid lines indicate is the behavior observed when the bypass capacitor C1 is the only load that is connected to the output terminal T2, and accordingly, when the charging of the bypass capacitor C1 is complete, the output current $I_{out}$ drops to zero. In a case where another load circuit is connected to the output terminal T2, however, a current commensurate with the load continues to flow even after the completion of the charging of the bypass capacitor C1 (as a dash-and-dot line in the figure indicates).

The high side switch circuit 10' configured as described above does serve, indeed, to limit the output current $I_{out}$ fed out via the output terminal T2 through feedback control as described above and thereby make softer to a certain degree the rush current that occurs when the USB device is plugged into the host computer. Thus, it is possible to prevent to a certain extent the power supply circuit provided in the host computer from being overloaded. In addition, the output current $I_{out}$ from the high side switch circuit 10' is first accumulated in the bypass capacitor C1 before it is fed out. This helps make smooth and reduce the noise components in the current that is fed to the internal circuits of the USB device.

However, in the conventional high side switch circuit 10', the bypass capacitor C1 is given a fixed capacitance that is so set that the peak value of the current that charges it and the time needed to charge it comply with the USB standard and the specifications of the ICs used internally. That is, it is impossible to adjust the waveform of the current that charges the bypass capacitor C1 according to the power supply performance of the power supply circuit provided in the host computer, the characteristics of the USB cable, and other factors (i.e. to adjust it, for example, in such a way that the peak value of the current that charges the bypass capacitor C1 and the time needed to charge it comply with the USB standard and the IC specifications, and simultaneously that the output current $I_{out}$ rises as softly as possible).

SUMMARY OF THE INVENTION

An object of the present invention is to provide an electrical device that has an output transistor for limiting an input current fed from outside to produce an output current and a bypass capacitor connected to the output side of the output transistor but that nevertheless permits the waveform of the current that charges the bypass capacitor to be adjusted without varying the capacitance thereof.

To achieve the above object, according to the present invention, an electrical device is provided with: an output transistor for limiting an input current fed from outside the electrical device to produce an output current to be fed to inside the electrical device; an output controller for controlling the current limiting operation of the output transistor; and a bypass capacitor connected to the output side of the output transistor. Here, the waveform of the current that charges the bypass capacitor is adjusted by varying the limit value of the output current without varying the capacitance of the bypass capacitor.

BRIEF DESCRIPTION OF THE DRAWINGS

This and other objects and features of the present invention will become clear from the following description, taken in conjunction with the preferred embodiments with reference to the accompanying drawings in which:

FIG. 3 is a time chart showing the behavior of the input voltage $V_{in}$, the soft current $I_{soft}$, the reference voltage $V_{ref}$, and the output current $I_{out}$ in the high side switch circuit 10a;

DESCRIPTION OF THE PREFERRED EMBODIMENTS

Figure 1:
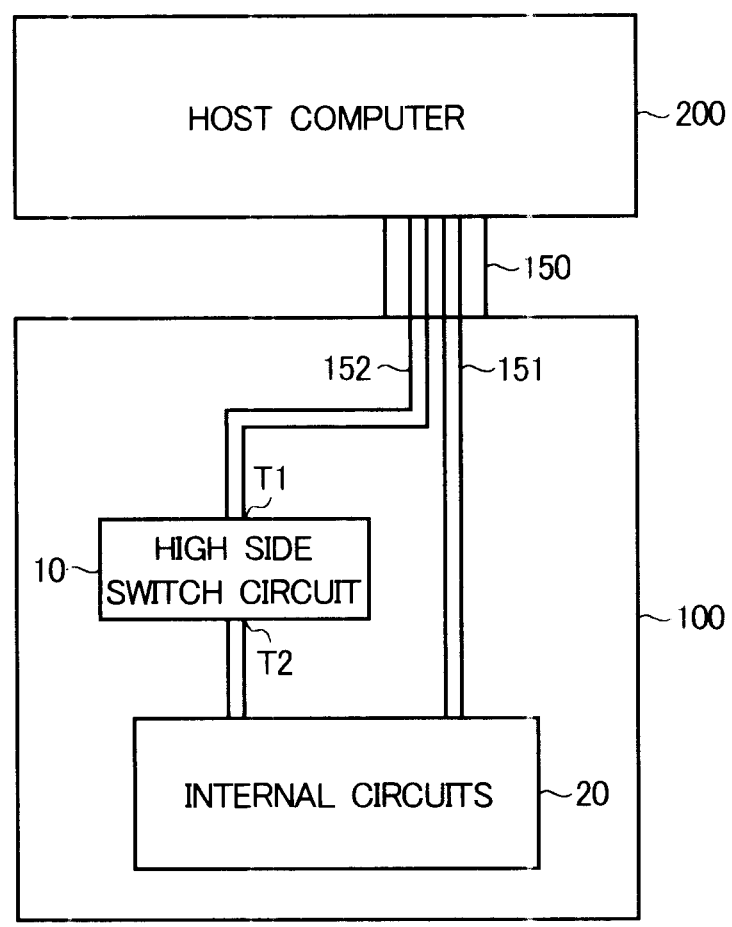
FIG. 1 is a block diagram showing an outline of the configuration of a computer system including a USB device embodying the present invention.

Hereinafter, electrical devices embodying the present invention will be described with reference to the drawings, taking up peripheral devices equipped with a USB interface bus (hereinafter referred to simply as "USB devices") as examples. FIG. 1 is a block diagram showing an outline of the configuration of a computer system including a USB device embodying the invention.

As the figure shows, the USB device 100 is connected by way of a USB cable 150 to a host computer 200, such as a personal computer. For easy connection and convenience, the USB cable 150 includes not only signal lines 151 by way of which signals are exchanged between the USB device 100 and the host computer 200, but also power supply lines 152 by way of which electric power is supplied from the host computer 200 to the USB device 100.

Inside the USB device 100, the signal lines 151 are connected to internal circuits 20 to permit the USB device 100 and the host computer 200 to exchange signals. On the other hand, the power supply lines 152 are connected, not directly but through a high side switch circuit 10, to the internal circuits 20.

Figure 2:
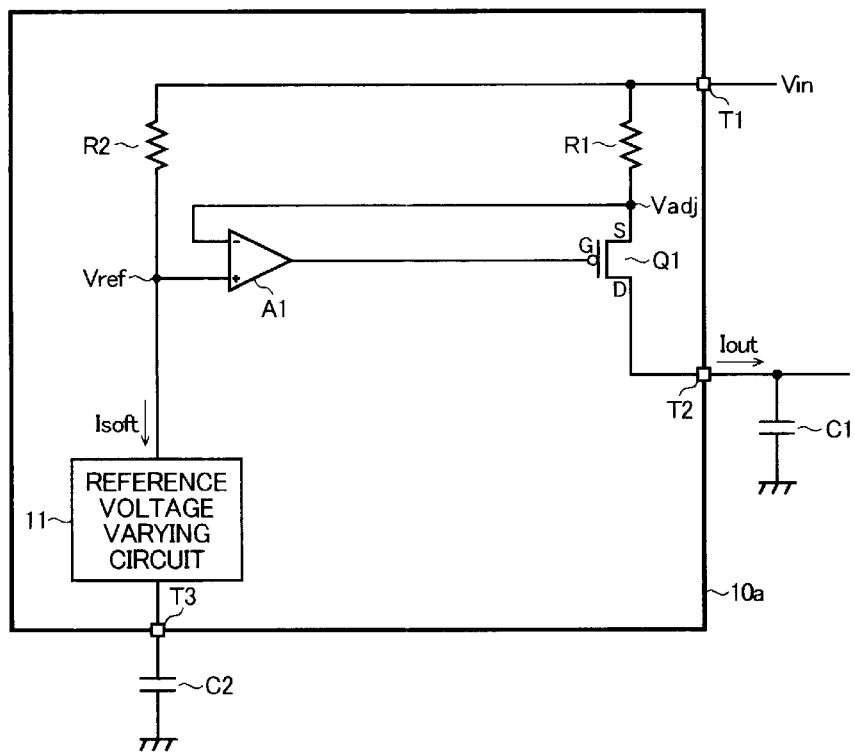
FIG. 2 is a circuit diagram showing an outline of the configuration of a high side switch circuit 10a in a first embodiment of the invention.

The high side switch circuit 10 is configured as a current limiter that limits the supply current supplied from the host computer 200 to a predetermined level. FIG. 2 is a circuit diagram showing an outline of the configuration of the high side switch circuit 10a in a first embodiment of the invention. As this figure shows, in this embodiment, the high side switch circuit 10a is configured in almost the same manner as the conventional high side switch circuit 10' (see FIG. 10). Therefore, in the following descriptions of this embodiment, such circuit elements as have comparable configurations and functions between the conventional example and this embodiment are identified with the same reference numerals as used in FIG. 10, and their explanations will not be repeated, with emphasis placed on features unique to this embodiment.

Figure 10:
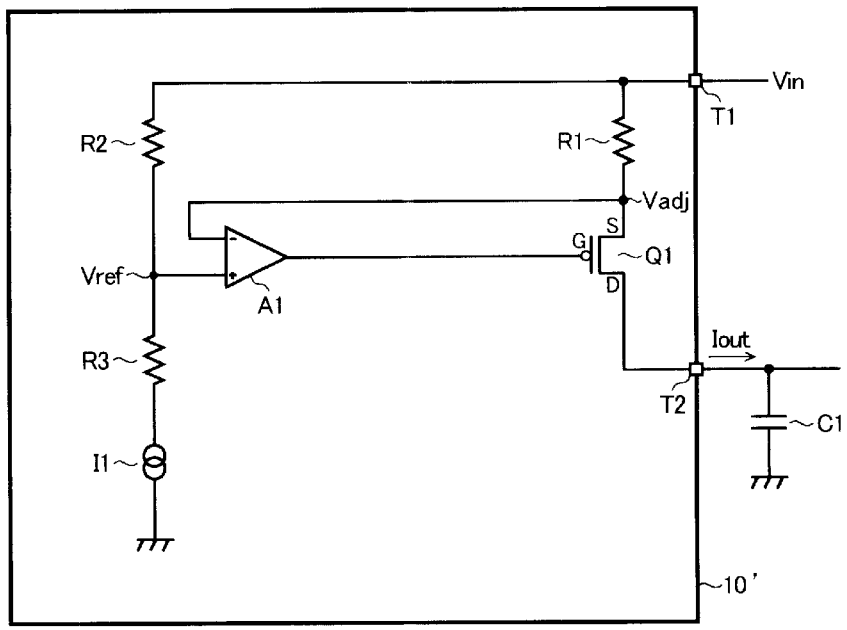
FIG. 10 is a circuit diagram showing an example of the configuration of a conventional high side switch circuit.
Figure 11:
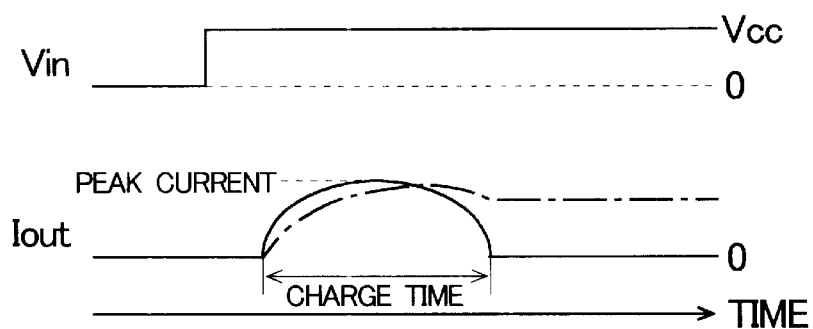
FIG. 11 is a time chart showing the behavior of the input voltage $V_{in}$ and the output current $I_{out}$ in the conventional high side switch circuit 10'.

In this embodiment, to permit the waveform of the current that charges the bypass capacitor C1 without varying its capacitance, the high side switch circuit 10a is provided with a reference voltage varying circuit 11 that varies the reference voltage $V_{ref}$ that is fed to the operational amplifier A1. One end of the reference voltage varying circuit 11 is connected to the node between the resistor R2 and the non-inverting input terminal (+) of the operational amplifier A1, and the other end of the reference voltage varying circuit 11 is connected to ground through an adjustment capacitor C2 that is connected to an adjustment terminal T3. Here, as the result of the provision of the reference voltage varying circuit 11, the resistor R3 and the constant-current source I1 shown in FIG. 10 are omitted.

Next, how this high side switch circuit 10a configured as described above operates will be described. The reference voltage varying circuit 11 described above is a circuit that varies the reference voltage $V_{ref}$ fed to the operational amplifier A1 by varying the current that flows through the resistor R2 (hereinafter, this current will be referred to as the "soft current $I_{soft}$"). The rate at which the reference voltage varying circuit 11 varies the reference voltage per unit time can be freely adjusted by varying the capacitance of the adjustment capacitor C2.

Figure 3:
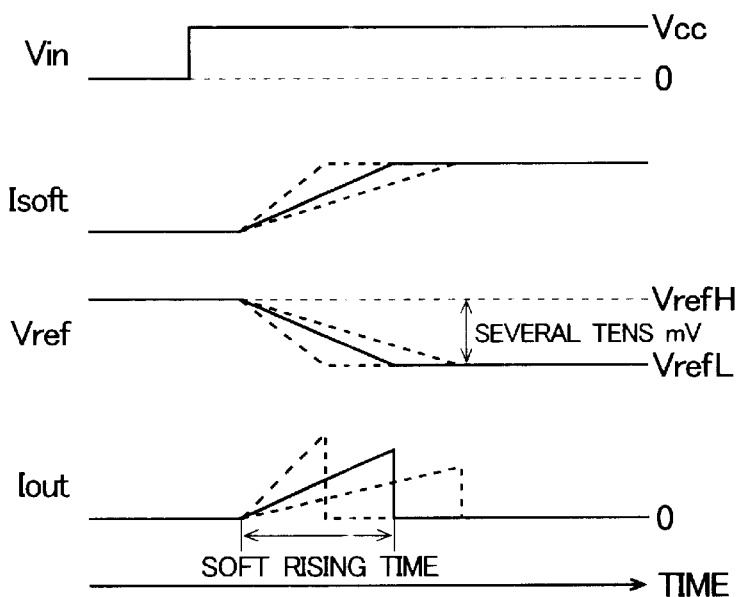

FIG. 3 is a time chart showing the behavior of the input voltage $V_{in}$, the soft current $I_{soft}$, the reference voltage $V_{ref}$, and the output current $I_{out}$ in the high side switch circuit 10a. For simplicity's sake, what is shown in this figure is the behavior observed when the bypass capacitor C1 is the only load connected to the output terminal T2. As this figure shows, when an input voltage $V_{in}$ is applied to the input terminal T1 of the high side switch circuit 10a, an output current $I_{out}$ starts flowing through the bypass capacitor C1; when its charging is complete, the output current $I_{out}$ drops to zero. In a case where another load circuit is connected to the output terminal T2, a current commensurate with the load continues to flow through the bypass capacitor C1 even after the completion of its charging.

Here, the reference voltage varying circuit 11 gradually increases the soft current $I_{soft}$ that flows through the resistor R2, and therefore the voltage drop across the resistor R2 gradually becomes greater. Thus, the reference voltage $V_{ref}$ fed to the operational amplifier A1 gradually becomes lower until it eventually becomes equal to $V_{ref}L$. That is, when electric power starts being supplied to the USB device 100, the reference voltage varying circuit 11 varies the reference voltage $V_{ref}$ by several tens of millivolts from $V_{ref}H$ to $V_{ref}L$ so that the limit that the transistor Q1 places on the current flowing through it gradually becomes less strict. Here, the voltages $V_{ref}H$ to $V_{ref}L$ are both very close to the supplied voltage $V_{CC}$.

It is advisable that the upper limit of the soft current $I_{soft}$ controlled by the reference voltage varying circuit 11, i.e. the lower limit $V_{ref}L$ of the reference voltage $V_{ref}$, be set on the basis of the ultimate target value of the output current $I_{out}$. For example, as shown in FIG. 3, the soft current $I_{soft}$ is so controlled as to reach its maximum approximately simultaneously when the charging of the bypass capacitor C1 by the output current $I_{out}$ is complete, or so controlled as not to reach its maximum before the output current $I_{out}$ reaches its maximum.

As described above, immediately after electric power starts being supplied to the USB device 100, a strict limit is placed on the output current $I_{out}$, and the limit is then made less and less strict as time passes. This configuration makes it possible not only to make softer the rising of the rush current that occurs when the USB device 100 is plugged into the host computer 200 as compared with the conventional configuration, but also to optimize the time required by the softer rising of the rush current (for example, the time required by the softer rising=the time required to charge the bypass capacitor C1). In this way, it is possible to prevent more securely the power supply circuit provided in the host computer 200 from being overloaded.

Moreover, in the high side switch circuit 10a of this embodiment, the rate at which the reference voltage varying circuit 11 varies the reference voltage per unit time can be freely adjusted by varying the capacitance of the adjustment capacitor C2. This makes it possible to freely adjust the waveform of the current that charges the bypass capacitor C1 according to the power supply performance of the power supply circuit provided in the host computer 200, the characteristics of the USB cable 150, and other factors as broken lines indicate in the figure. This makes it easy to optimize the power supply design of the USB device 100.

Figure 4:
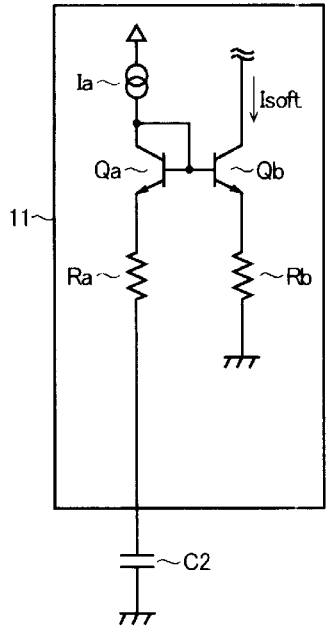
FIG. 4 is a circuit diagram showing an example of the configuration of the reference voltage varying circuit 11.

Next, the internal configuration of the reference voltage varying circuit 11 described above will be described. FIG. 4 is a circuit diagram showing an example of the configuration of the reference voltage varying circuit 11. The reference voltage varying circuit 11 has a pair of NPN transistors Qa and Qb, of which the bases are connected together. The collector of the transistor Qa is connected to its own base, and is also connected through a constant-current source Ia to a supply voltage line (input terminal T1). The emitter of the transistor Qa is connected through a resistor Ra and then through the adjustment capacitor C2 to ground.

On the other hand, the collector of the transistor Qb is connected to the node between the resistor R2 and the non-inverting input terminal (+) of the operational amplifier A1, and the emitter of the transistor Qb is connected through a resistor Rb to ground. The resistor Rb has a higher resistance than the resistor Ra.

In the reference voltage varying circuit 11 configured as described above, when a supply voltage $V_{in}$ is applied to the supply voltage line, a current starts flowing into the adjustment capacitor C2 and thereby charging it. Immediately after the supply voltage $V_{in}$ starts being supplied, no electric charge is accumulated in the adjustment capacitor C2, and therefore, with the emitter voltage of the transistor Qa low, a large collector current flows through the transistor Qa.

On the other hand, since the resistor Rb has a higher resistance than the resistor Ra, the emitter voltage of the transistor Qb is higher than the emitter voltage of the transistor Qa, and therefore the collector current of the transistor Qb is not so large as the collector current of the transistor Qa. In this way, immediately after the supply voltage $V_{in}$ starts being supplied, the collector current of the transistor Qb, i.e. the soft current $I_{soft}$, is held small.

However, as the charging of the adjustment capacitor C2 progresses and the emitter voltage of the transistor Qa becomes higher, the collector current of the transistor Qa becomes smaller and smaller, and instead accordingly larger currents flow into the bases of the transistors Qa and Qb. As a result, the voltage difference between the base and emitter of the transistor Qb becomes greater, and the collector current of the transistor Qb, i.e. the soft current $I_{soft}$, gradually becomes larger.

In this way, the reference voltage varying circuit 11 gradually increases the soft current $I_{soft}$. Here, the rising of the soft current $I_{soft}$ can be made more abrupt by setting the capacitance of the adjustment capacitor C2 lower, and can be made softer by setting the capacitance of the adjustment capacitor C2 higher. Instead of varying the capacitance of the adjustment capacitor C2, it is also possible to vary the resistance of the resistor R2 to achieve adjustment of the soft current $I_{soft}$ similar to that described above.

Figure 5:
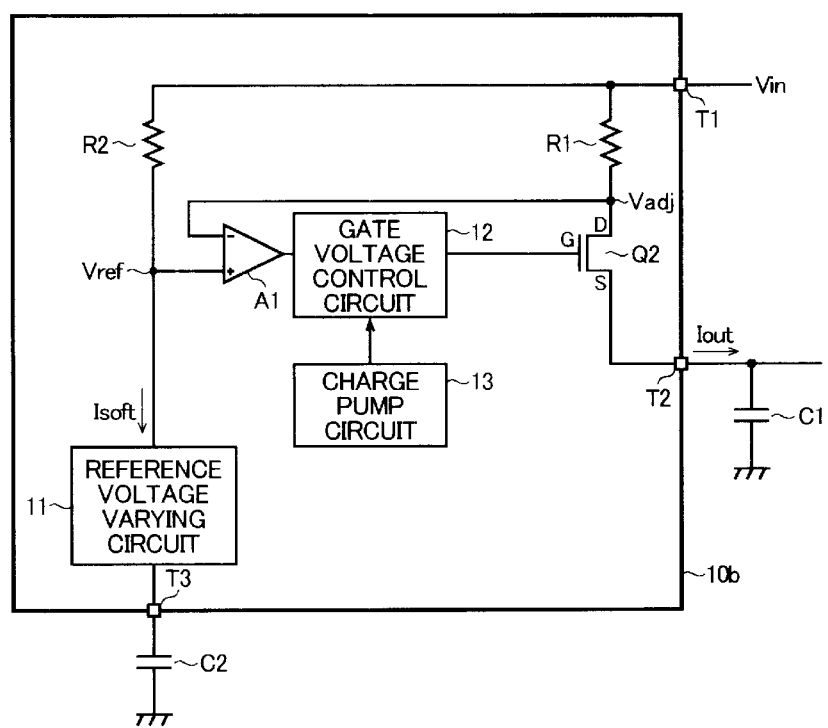
FIG. 5 is a circuit diagram showing an outline of the configuration of a high side switch circuit 10b in a second embodiment of the invention.

Next, a second embodiment of the invention will be described. FIG. 5 is a circuit diagram showing an outline of the configuration of a high side switch circuit 10b in the second embodiment. As this figure shows, the high side switch circuit 10b of this embodiment is configured in almost the same manner as the high side switch circuit 10a (see FIG. 2) of the first embodiment described above, but uses an N-channel MOS transistor Q2 as the output transistor. Therefore, in the following descriptions of this embodiment, such circuit elements as have comparable configurations and functions between the first and this embodiment are identified with the same reference numerals as used in FIG. 2, and their explanations will not be repeated, with emphasis placed on features unique to this embodiment.

As described above, in this embodiment, an N-channel MOS transistor Q2 is used as the output transistor, and its drain (D) and source (S) are connected the other way around as compared with the first embodiment. Specifically, the transistor Q2 has its drain (D) connected through the resistor R1 to the input terminal T1, and has its source (S) connected to the output terminal T2. Moreover, between the output terminal of the operational amplifier A1 and the gate (G) of the transistor Q2, a gate voltage control circuit 12 is provided, and this gate voltage control circuit 12 is connected to a charge pump circuit 13.

The gate voltage control circuit 12 controls the gate voltage of the transistor Q2 on the basis of the output voltage of the operational amplifier A1. Specifically, as the output voltage of the operational amplifier A1 becomes higher, the gate voltage control circuit 12 decreases the gate voltage of that transistor and, as the output voltage of the operational amplifier A1 becomes lower, it increases the gate voltage of that transistor. This operation of the gate voltage control circuit 12 makes it possible to use an N-channel MOS transistor Q2 as the output transistor to realize the same operation as realized by the first embodiment described earlier.

The charge pump circuit 13 includes an oscillator circuit (not shown), by the use of which it steps up the gate voltage applied to the gate (G) of the transistor Q2. The provision of a voltage step-up mechanism like this helps lower the on resistance of the transistor Q2. This makes it possible to reduce the power consumed by the transistor Q2 and thereby lower the power consumption of the high side switch circuit 10b as a whole.

Figure 6:
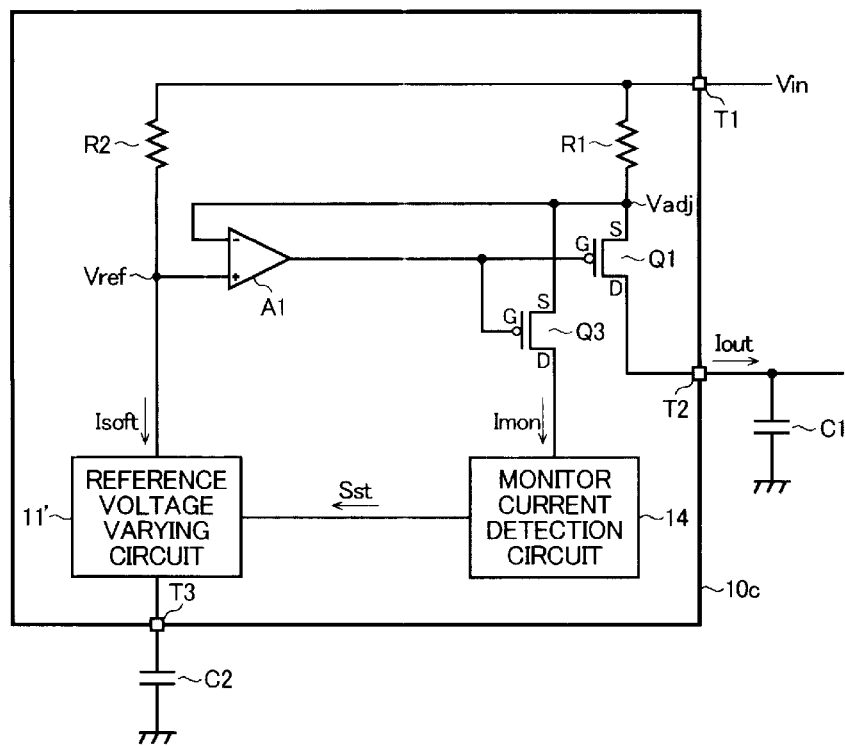
FIG. 6 is a circuit diagram showing an outline of the configuration of a high side switch circuit 10c in a third embodiment of the invention.

Next, a third embodiment of the invention will be described. FIG. 6 is a circuit diagram showing an outline of the configuration of a high side switch circuit 10c in the third embodiment. As this figure shows, the high side switch circuit 10c of this embodiment is configured in almost the same manner as the high side switch circuit 10a (see FIG. 2) of the first embodiment described earlier, but is provided additionally with a monitor current detection circuit 14 that detects the rising of the output current $I_{out}$. Therefore, in the following descriptions of this embodiment, such circuit elements as have comparable configurations and functions between the first and this embodiment are identified with the same reference numerals as used in FIG. 2, and their explanations will not be repeated, with emphasis placed on features unique to this embodiment.

In this embodiment, as a means for synchronizing the timing with which the reference voltage $V_{ref}$ starts being varied with the timing with which the output current $I_{out}$ starts rising, the monitor current detection circuit 14 mentioned above and a P-channel MOS transistor Q3 for detecting a monitor current are provided. The transistor Q3 has its source (S) connected through the resistor R1 to the input terminal T1, has its gate (G) connected to the output terminal of the operational amplifier A1, and has its drain (D) connected to the monitor current detection circuit 14.

Thus, when electric power starts being supplied to the high side switch circuit 10c configured as described above and an output current $I_{out}$ starts flowing through the transistor Q1, synchronously a monitor current $I_{mon}$ also starts flowing through the transistor Q3. The monitor current detection circuit 14 detects the rising of this monitor current $I_{mon}$, and feeds a variation start signal $S_{st}$ to the reference voltage varying circuit 11'.

The monitor current detection circuit 14, although its configuration is not illustrated, is realized, for example, by connecting the drain (D) of the transistor Q3 through a constant-current source to ground and extracting the variation start signal $S_{st}$ from the node between this constant-current source and the drain (D) of the transistor Q3 through a buffer.

Figure 7:
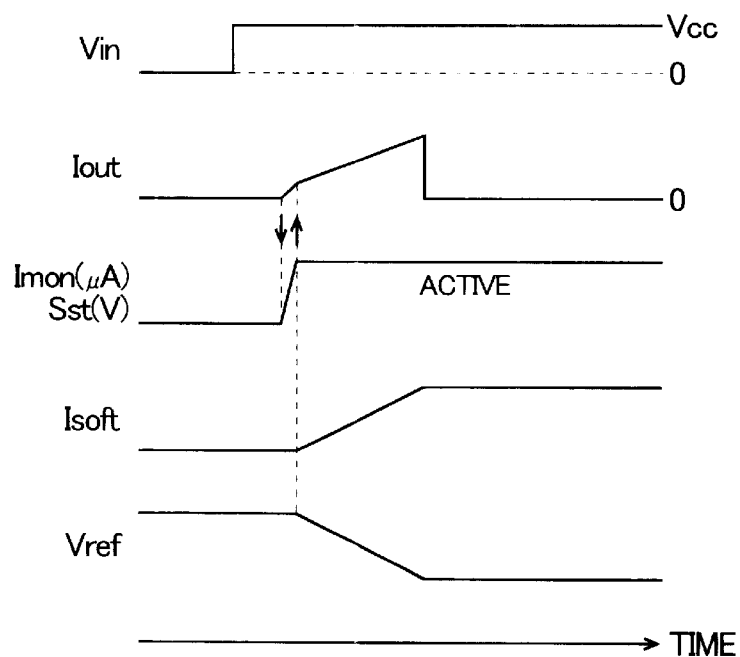
FIG. 7 is a time chart showing the behavior of the input voltage $V_{in}$, the output current $I_{out}$, the monitor current $I_{mon}$, the variation start signal $S_{st}$, the soft current $I_{soft}$, and the reference voltage $V_{ref}$ in the high side switch circuit 10c.

FIG. 7 is a time chart showing the behavior of the input voltage $V_{in}$, the output current $I_{out}$, the monitor current $I_{mon}$, the variation start signal $S_{st}$, the soft current $I_{soft}$, and the reference voltage $V_{ref}$ in the high side switch circuit 10c. For simplicity's sake, what is shown in this figure is the behavior observed when the bypass capacitor C1 is the only load connected to the output terminal T2. As this figure shows, when an input voltage $V_{in}$ is applied to the input terminal T1 of the high side switch circuit 10c, an output current $I_{out}$ and a monitor current $I_{mon}$ start flowing through the transistors Q1 and Q3, respectively; when the charging of the bypass capacitor C1 is complete, the output current $I_{out}$ drops to zero. In a case where another load circuit is connected to the output terminal T2, a current commensurate with the load continues to flow even after the completion of the charging of the bypass capacitor C1.

The monitor current detection circuit 14 detects the rising of the aforementioned monitor current $I_{mon}$, and feeds a variation start signal $S_{st}$ to the reference voltage varying circuit 11'. At the time point when the variation start signal $S_{st}$ becomes active, the reference voltage varying circuit 11' starts gradually increasing the soft current $I_{soft}$ to start varying the reference voltage $V_{ref}$. By synchronizing the timing with which the reference voltage varying circuit 11' starts varying the reference voltage $V_{ref}$ with the timing with which the output current $I_{out}$ starts rising in this way, it is possible to make the soft rising of the output current $I_{out}$ smoother.

Figure 8:
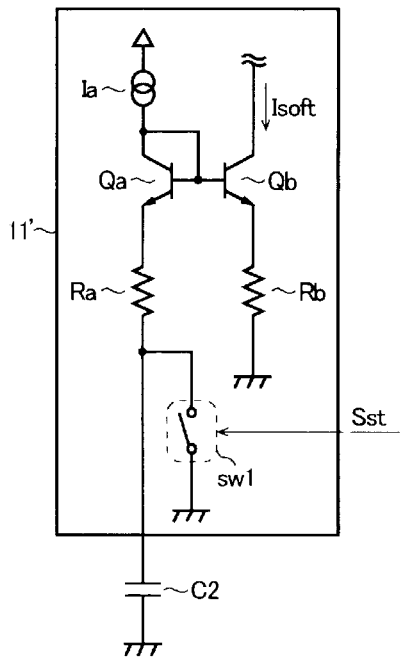
FIG. 8 is a circuit diagram showing an example of the configuration of the reference voltage varying circuit 11'.

Next, the internal configuration of the reference voltage varying circuit 11' described above will be described. FIG. 8 is a circuit diagram showing an example of the configuration of the reference voltage varying circuit 11'. As this figure shows, the reference voltage varying circuit 11' of this embodiment is configured in almost the same manner as the reference voltage varying circuit 11 (see FIG. 4) of the first embodiment, but is provided additionally with a switch sw1 of which the on/off state is controlled by the variation start signal $S_{st}$ from the monitor current detection circuit 14. Therefore, in the following descriptions of this embodiment, such circuit elements as have comparable configurations and functions between the first and this embodiment are identified with the same reference numerals as used in FIG. 4, and their explanations will not be repeated, with emphasis placed on features unique to this embodiment.

One end of the switch sw1 is connected to the node between the resistor Ra and the adjustment capacitor C2, and the other end of the switch sw1 is connected to ground. The on/off state of this switch sw1 is controlled by the variation start signal $S_{st}$ in such a way that, when the variation start signal $S_{st}$ becomes active, the switch sw1 turns from on to off.

Thus, in the reference voltage varying circuit 11', even when the supply voltage $V_{in}$ is applied to the supply voltage line, the adjustment capacitor C2 does not start being charged until the output current $I_{out}$ (and thus the monitor current $I_{mon}$) of the high side switch circuit 10c rises and makes the variation start signal $S_{st}$ active. Meanwhile, the collector current of the transistor Qb, i.e. the soft current $I_{soft}$ is kept small.

Thereafter, when the output current $I_{out}$ of the high side switch circuit 10c rises and makes the variation start signal $S_{st}$ active, the switch sw1 turns off, and thus the adjustment capacitor C2 starts being charged. Now, the reference voltage varying circuit 11' operates as described earlier to gradually increase the soft current $I_{soft}$. In this way, at the time point when the variation start signal $S_{st}$ becomes active, the reference voltage varying circuit 11' of this embodiment starts gradually increasing the soft current $I_{soft}$ to start varying the reference voltage $V_{ref}$.

Figure 9:
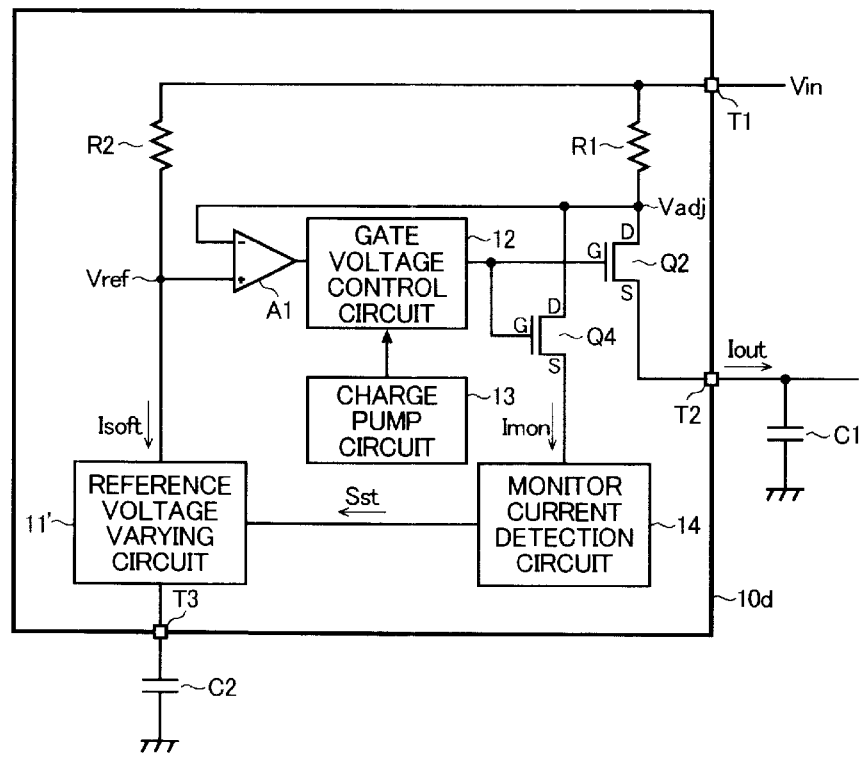
FIG. 9 is a circuit diagram showing an outline of the configuration of a high side switch circuit 10d in a fourth embodiment of the invention.

Next, a fourth embodiment of the invention will be described. FIG. 9 is a circuit diagram showing an outline of the configuration of a high side switch circuit 10d in the fourth embodiment. As this figure shows, the high side switch circuit 10d of this embodiment is configured in almost the same manner as the high side switch circuit 10c (see FIG. 6) of the third embodiment described above, but uses N-channel MOS transistors Q2 and Q4 as the output transistor and the monitor current detection transistor. Therefore, in the following descriptions of this embodiment, such circuit elements as have comparable configurations and functions between the third and this embodiment are identified with the same reference numerals as used in FIG. 6, and their explanations will not be repeated, with emphasis placed on features unique to this embodiment As described above, in this embodiment, N-channel MOS transistors Q2 and Q4 are used as the output transistor and the monitor current detection transistor, and their drains (D) and sources (S) are connected the other way around as compared with the third embodiment. Specifically, the transistors Q2 and Q4 have their drains (D) connected through the resistor R1 to the input terminal T1, and have their sources (S) connected to the output terminal T2 or the monitor current detection circuit 14. Moreover, between the output terminal of the operational amplifier A1 and the gates (G) of the transistors Q2 and Q4, a gate voltage control circuit 12 is provided, and this gate voltage control circuit 12 is connected to a charge pump circuit 13.

The gate voltage control circuit 12 controls the gate voltages of the transistors Q2 and Q4 on the basis of the output voltage of the operational amplifier A1. Specifically, as the output voltage of the operational amplifier A1 becomes higher, the gate voltage control circuit 12 decreases the gate voltages of those transistors and, as the output voltage of the operational amplifier A1 becomes lower, it increases the gate voltages of those transistors. This operation of the gate voltage control circuit 12 makes it possible to use N-channel MOS transistors Q2 and Q4 as the output transistor and the monitor current detection transistor to realize the same operation as realized by the third embodiment described earlier.

The charge pump circuit 13 includes an oscillator circuit (not shown), by the use of which it steps up the gate voltage applied to the gates (G) of the transistors Q2 and Q4. The provision of a voltage step-up mechanism like this helps lower the on resistances of the transistors Q2 and Q4. This makes it possible to reduce the power consumed by the transistors Q2 and Q4 and thereby lower the power consumption of the high side switch circuit 10d as a whole.

The embodiments described hereinbefore deal with cases in which P-channel or N-channel MOS transistors are used as the output transistor and the monitor current detection transistor. However, these MOS transistors may be replaced with PNP or NPN transistors, respectively.

The embodiments described hereinbefore deal with cases in which the present invention is applied to USB devices. However, the present invention is applicable not only to USB devices, but also to a wide range of electrical devices having an output transistor for limiting an input current to produce an output current and a bypass capacitor connected to the output side of the output transistor.

What is claimed is:

1. An electrical device comprising:

an output transistor for limiting an input current fed from outside the electrical device to produce an output current to be fed to inside the electrical device;

an output controller for controlling current limiting operation of the output transistor; and a bypass capacitor connected to an output side of the output transistor, wherein a waveform of a current that charges the bypass capacitor is adjusted by varying a limit value of the output current without varying a capacitance of the bypass capacitor, and wherein the output controller performs control in such a way that, when a supply current starts being supplied to the electrical device, the limit value of the output current is increased gradually.

2. An electrical device as claimed in claim 1, wherein a rate at which the limit value of the output current is varied per unit time can be adjusted by adjusting the output controller.

3. An electrical device as claimed in claim 1, wherein the output controller starts varying the limit value of the output current synchronously when the output current starts rising.

4. An electrical device as claimed in claim 1, wherein the electrical device is equipped with a USB (universal serial bus) as an interface bus and is designed as a bus-powered device that receives supply of electric power via the USB.

5. An electrical device comprising:

an output transistor for limiting an input current fed from outside the electrical device to produce an output current to be fed to inside the electrical device;

a detector for detecting a current flowing through the output transistor as a voltage;

an output controller for controlling current limiting operation of the output transistor in such a way that the voltage detected by the detector is kept equal to a reference voltage;

a bypass capacitor connected to an output side of the output transistor; and a reference voltage varier for varying the reference voltage, wherein a waveform of a current that charges the bypass capacitor is adjusted by varying the reference voltage and thereby varying a limit value of the output current without varying a capacitance of the bypass capacitor, and wherein, when a supply current starts being supplied to the electrical device, the reference voltage varier varies the reference voltage in such a way that the limit value of the output current increases gradually.

6. An electrical device as claimed in claim 5, wherein a rate at which the reference voltage is varied per unit time can be adjusted by varying a capacitance of an externally fitted capacitor.

7. An electrical device as claimed in claim 5, wherein the reference voltage starts being varied synchronously when the output current starts rising.

8. An electrical device as claimed in claim 5, further comprising:

an output current variation detector for detecting rising of a monitor current used to monitor the output current and instructing the reference voltage varier to start varying the reference voltage.

9. An electrical device as claimed in claim 5, wherein the output controller comprises:
- an operational amplifier for amplifying a differential voltage between the voltage detected by the detector and the reference voltage;
- a gate voltage control circuit for controlling a gate voltage of the output transistor according to an output voltage of the operational amplifier; and
- a charge pump circuit for stepping up the gate voltage of the output transistor.

10. An electrical device as claimed in claim 5, wherein the electrical device is equipped with a USB (universal serial bus) as an interface bus and is designed as a bus-powered device that receives supply of electric power via the USB.

11. A current limiting device comprising:

an output transistor for limiting an input current fed from outside the current limiting device to produce an output current to be fed to outside the current limiting device;

an output controller for controlling current limiting operation of the output transistor; and a bypass capacitor connected to an output side of the output transistor, wherein, when power starts being supplied to the current limiting device, the output controller adjusts a waveform of a current that charges the bypass capacitor by controlling a limit value of the output current so as to make the limit value increase gradually without varying a capacitance of the bypass capacitor.

12. A current limiting device as claimed in claim 11, wherein a rate at which the limit value of the output current is varied per unit time can be adjusted by adjusting the output controller.

13. A current limiting device as claimed in claim 11, wherein the output controller starts varying the limit value of the output current synchronously when the output current starts rising.

14. A current limiting device comprising:

an output transistor for limiting an input current fed from outside the current limiting device to produce an output current to be fed to outside the current limiting device;

a detector for detecting a current flowing through the output transistor as a voltage;

an output controller for controlling current limiting operation of the output transistor in such a way that the voltage detected by the detector is kept equal to a reference voltage;

a bypass capacitor connected to an output side of the output transistor; and a reference voltage varier for varying the reference voltage, wherein, when power starts being supplied to the current limiting device, the reference voltage varier adjusts a waveform of a current that charges the bypass capacitor by varying the reference voltage so as to make a limit value of the output current increase gradually without varying a capacitance of the bypass capacitor.

15. A current limiting device as claimed in claim 14, wherein a rate at which the reference voltage is varied per unit time can be adjusted by varying a capacitance of an externally fitted capacitor.

16. A current limiting device as claimed in claim 14, wherein the reference voltage starts being varied synchronously when the output current starts rising.

17. A current limiting device as claimed in claim 16, further comprising:

an output current variation detector for detecting rising of a monitor current used to monitor the output current and instructing the reference voltage varier to start varying the reference voltage.

18. A current limiting device as claimed in claim 14, wherein the output controller comprises:
- an operational amplifier for amplifying a differential voltage between the voltage detected by the detector and the reference voltage;
- a gate voltage control circuit for controlling a gate voltage of the output transistor according to an output voltage of the operational amplifier; and
- a charge pump circuit for stepping up the gate voltage of the output transistor.

* * * * *